United States Patent [19]

Cory

[11] Patent Number: 5,260,656
[45] Date of Patent: Nov. 9, 1993

[54] METHOD FOR IMPROVING THE RESOLUTION OF SOLID-STATE NMR MULTIPLE-PULSE IMAGING SYSTEMS

[75] Inventor: David G. Cory, Boston, Mass.
[73] Assignee: Bruker Instruments, Inc., Billerica, Mass.
[21] Appl. No.: 861,402
[22] Filed: Mar. 31, 1992
[51] Int. Cl.$^5$ .............................. G01R 33/20
[52] U.S. Cl. ..................... 324/309; 324/307
[58] Field of Search ............ 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,599,565 | 7/1986 | Hoenninger, III | 324/309 |
| 4,707,661 | 11/1987 | Hoenninger, III et al. | 324/309 |
| 4,857,846 | 8/1989 | Carlson | 324/309 |
| 4,982,161 | 1/1991 | Twieg | 324/309 |

OTHER PUBLICATIONS

"Time-Suspension Multiple-Pulse Sequences: Applications to Solid-State Imaging", D. G. Cory, J. B. Miller and A. N. Garroway Journal of Magnetic Resonance, vol. 90, pp. 205-213 (1990).
"Analysis of Multiple Pulse NMR in Solids, III", D. P. Burum and W. K. Rhim, Journal of Chemical Physics, vol. 71, p. 944 (1979).
"Nutation Sequences for Magnetic Resonance Imaging in Solids", H. M. Cho, C. J. Lee, D. N. Shykind and D. P. Weitekamp, Physical Review Letters, vol. 55, p. 1923 (1985).
"Pulsed Field Gradient NMR Imaging of Solids", J. B. Miller, D. G. Cory and A. N. Garroway, Chemical Physics Letters, vol. 164, No. 1, pp. 1-4 (1989).
"Multiple-Pulse Methods of 1H N.M.R. Imaging of Solids: Second Averaging", D. G. Cory, J. B. Miller, R. Turner and A. N. Garroway, Molecular Physics, vol. 70, No. 2, pp. 331-345 (1990).
"A New Multiple-Pulse Cycle For Homonuclear Dipolar Decoupling", D. G. Cory, Journal of Magnetic Resonance, vol. 94, p. 526 (1991).
"Solid-State NMR Imaging by Magic Sandwich Echoes", S. Matsui, Chemical Physics Letters, vol. 197, p. 187 (1991).
"Spatially Resolved Proton NMR Dipolar Spectra as A Measure of Local Molecular Mobility in Solids", S. Matsui, Journal of Magnetic Resonance, vol. 95, p. 149 (1991).

*Primary Examiner*—Michael J. Tokar
*Attorney, Agent, or Firm*—Cesari and McKenna

[57] ABSTRACT

In an NMR solid-state imaging experiment, a pulsed gradient is interleaved between subcycles of a line-narrowing RF pulse sequence in such a manner that the RF and gradient fields do not overlap in time, the subcycles of RF modulation which occur between gradient pulses are either cyclic or anti-cyclic and symmetric.

The line-narrowing pulse sequence can be broken into subcycles, each of which is dipolar decoupling to at least a zero-order approximation. The gradient pulses are intercalated between a selected set of the subcycles which are symmetric. In this manner the prior art zero-order decoupling of the line narrowing interaction and the gradient interaction is extended to include the zero order and all odd order terms in the Magnus expansion of the average dipolar Hamiltonian. If the selected subcycle is dipolar decoupling to second order, then the gradient will also be decoupled to second order.

16 Claims, 7 Drawing Sheets

Fig. 4A LINE NARROWING

Fig. 4B GRADIENT (PRIOR ART)

Fig. 6A LINE NARROWING

Fig. 6B GRADIENT

Fig. 9

METHOD FOR IMPROVING THE RESOLUTION OF SOLID-STATE NMR MULTIPLE-PULSE IMAGING SYSTEMS

FIELD OF THE INVENTION

This invention relates to NMR imaging and, in particular, to multiple-pulse solid state imaging and methods for improving the resolution homogeneity of solid state images.

BACKGROUND OF THE INVENTION

Many atomic nuclei possess a magnetic moment. Nuclear magnetic resonance (NMR) is a phenomenon exhibited by this select group of atomic nuclei (termed "NMR active" nuclei), which results from the interaction of the nuclei with an applied, external magnetic field.

The magnetic properties of a nucleus are conveniently discussed in terms of two quantities: the magnetogyric ratio (denoted by the symbol $\gamma$); and the nuclear spin (denoted by the symbol I). When an NMR active nucleus is placed in a magnetic field, its nuclear magnetic energy levels are split into $(2I+1)$ non-degenerate energy levels, and these levels are separated from each other by a characteristic energy that is directly proportional to the strength of the applied magnetic field. This phenomenon is called "Zeeman" splitting and the characteristic energy is equal to $\gamma h H_o/2\pi$, where h is Plank's constant and $H_o$ is the strength of the magnetic field. The frequency corresponding to the energy of the Zeeman splitting ($\omega_o = \gamma H_o$) is called the "Larmor frequency" or "resonance" frequency. Typical NMR active nuclei include $^1H$ (protons), $^{13}C$, $^{19}F$, and $^{31}P$ nuclei. For these four nuclei, the nuclear spin $I = \frac{1}{2}$, and, accordingly, each nucleus has two nuclear magnetic energy levels.

When a bulk material sample containing NMR active nuclei is placed within a magnetic field, the nuclear spins distribute themselves amongst the nuclear magnetic energy levels in a known manner in accordance with Boltzmann's statics. This distribution results in a population imbalance between the energy levels and a net nuclear magnetization. It is this net nuclear magnetization that is studied by NMR techniques.

At equilibrium, the net nuclear magnetization is aligned with the external magnetic field and is time-independent. A second magnetic field perpendicular to the first magnetic field and rotating at, or near, the Larmor frequency can also be applied to the nuclei and this second field disturbs the equilibrium and induces a coherent motion (a "nutation") of the net nuclear magnetization. Since, at conventional magnetic field strengths, the Larmor frequency of typical NMR active nuclei is in the megahertz range, this second field is called a "radio-frequency field" (RF field). The effect of the RF field is to rotate the spin magnetization about the direction of the applied RF field. The time duration of the applied RF field determines the angle through which the spin magnetization nutates and, by convention, an RF pulse of sufficient length to nutate the nuclear magnetization through an angle of 90° or $\pi/2$ radians, is called a "$\pi/2$ pulse".

A $\pi/2$ pulse applied at a frequency near the resonance frequency will rotate a spin magnetization that was aligned along the external magnetic field direction in equilibrium into a plane perpendicular to the external magnetic field. The component of the net magnetization that is transverse to the external magnetic field then precesses about the external magnetic field at the Larmor frequency. This precession can be detected with a resonant coil located with respect to the sample such that the precessing magnetization induces a voltage across the coil. Frequently, the "transmitter" coil employed to apply the RF field to the sample and cause the spin magnetization to nutate and the "receiver" coil employed to detect the resulting precessing magnetization are one and the same coil. This coil is generally part of an NMR probe.

In addition to processing at the Larmor frequency, the magnetization induced by the applied RF field changes and reverts to the equilibrium condition over time as determined by two relaxation processes: (1) dephasing within the transverse plane ("spin-spin relaxation") with an associated relaxation time, $T_2$, and (2) a return to the equilibrium population of the nuclear magnetic energy levels ("spin-lattice relaxation") with an associated relaxation time, $T_1$.

In order to use the NMR phenomenon to obtain an image of a sample, a magnetic field is applied to the sample, along with a magnetic field gradient which depends on physical position so that the field strength at different sample locations differs. When a field gradient is introduced, as previously mentioned, since the Larmor frequency for a particular nuclear type is proportional to the applied field, the Larmor frequencies of the same nuclear type will vary across the sample and the frequency variance will depend on physical position. By suitably shaping the applied magnetic field and processing the resulting NMR signals for a single nuclear type, a nuclear spin density image of the sample can be developed.

When an external magnetic field is applied to a nuclei in a chemical sample, the nuclear magnetic moments of the nuclei each experience a magnetic field that is reduced from the applied field due to a screening effect from the surrounding electron cloud. This screening results in a slight shift of the Larmor frequency for each nucleus (called the "chemical shift" since the size and symmetry of the shielding is dependent on the chemical composition of the sample).

In addition to the applied external magnetic field, each nucleus is also subject to local magnetic fields such as those generated by other nuclear and electron magnetic moments associated with nuclei and electrons located nearby. Interaction between these magnetic moments are called "couplings", and one important example of such couplings is the "dipolar" coupling. When the couplings are between nuclei of like kind, they are called "homo-nuclear couplings". In solids, the NMR spectra of spin$= \frac{1}{2}$ nuclei are often dominated by dipolar couplings, and in particular by dipolar couplings with adjacent protons. These interactions affect imaging by broadening the natural resonance linewidth and thereby reducing the image resolution.

In order to reduce the effect of such couplings, a class of experiments employs multiple-pulse coherent averaging to continuously modulate the internal Hamiltonians such that, in an interaction frame, selected Hamiltonians are scaled. A sub-class of such experiments is designed to reduce the effects of homonuclear dipolar couplings by averaging the dipolar Hamiltonian to zero over a selected time period in this interaction frame. The most widely used group of these latter experiments consists of long trains of RF pulses applied in quadrature. Data is sampled between groups of pulses.

Multiple-pulse coherent averaging requires that the spin Hamiltonian be toggled through a series of predetermined states, the average of which has the desired property that the dipolar interaction appears to vanish. If an additional requirement is satisfied that the final Hamiltonian state of the series is equivalent to the first Hamiltonian state of the series, the process can be repeated and the temporal response of the sample can be mapped out successively, point-by-point.

If an experiment is performed as described above with the final state exactly equaling the initial state, the result is particularly uninteresting since the result is the same as if nothing had happened to the nuclei between observations. In practice, in order to produce a more interesting result, an interaction of interest, such as a gradient interaction, is allowed to rotate the spin system slightly between successive observations. Although the undesirable interactions, such as dipolar couplings are almost always much larger than the interactions of interest, in some cases the experiment can be cleverly designed so that this slight rotation will have a minimal influence on the averaging of the undesirable interactions. More often though, the effective rotation of the desired interaction does interfere with the coherent averaging process and must be kept within some limits to maintain effective averaging.

For solid-state NMR imaging, in which the dipolar coupling effect is especially strong, a particularly appealing multiple-pulse sequence is a "time-suspension" cycle that aims at averaging all internal Hamiltonians to zero. Therefore, the observed evolution results solely from external interactions, such as the gradient interaction, and the resonance line width is reduced as much as possible. All else being equal, the more success that a technique has in narrowing the resonance linewidth, the better the quality of the image that can be obtained.

For abundant spin=½ nuclei in solids, the most obvious undesirable interaction to reduce is the homo-nuclear dipolar interaction, since this is the dominant interaction. The weak coupling of the nuclear magnetic moment to the lattice, the long relaxation times, and the ability to perturb the spin state virtually instantaneously via RF pulses allows the nuclear spin dynamics to be strongly modulated, and it is possible to employ this modulation to periodically refocus selected interactions. In view of this, prior art approaches for line narrowing generally are derived from average Hamiltonian theory. In accordance with this theory, the stationary laboratory reference coordinate system or frame can be mathematically transformed into another coordinate frame which simplifies the observation of an interaction. For example, the nuclear spin dynamics can be viewed in an interaction frame in which the spin dynamics modulation appears as a time-dependent Hamiltonian. In this frame, under a combination of periodic and cyclic conditions, the long-time behavior of the spin system is the time average of the associated interaction frame Hamiltonian over the repeated short cycles.

More particularly, the general approach is outlined as follows. A time-dependent RF field is defined in accordance with the following equation:

$$RF(t) = A_x(t)I_x + A_y(t)I_y \qquad (1)$$

where $A_x$ and $A_y$ are time-dependent RF field amplitudes and $I_x$ and $I_y$ are the x and y components of the field vector. If the RF field is periodic, that is, it meets the constraint defined by the following equation:

$$RF(t) = RF(t + T_c) \qquad (2)$$

and cyclic, in that it meets the requirements of the following equation:

$$\int_0^{t_c} \exp\{-iRF(t)\}dt = 1 \qquad (3)$$

then the long term behavior of the spin dynamics will follow the average of the spin dynamics over a single cycle.

For convenience, an interaction frame is normally selected that moves with the spins in response to the RF pulses. This interaction frame is the simplest to deal with since the RF interaction is large, under experimental control and ideally uniform across the sample (that is, all spin packets experience the same interaction frame). The zero-order averaged Hamiltonians that will dictate the spin dynamics are therefore, $$\frac{1}{t_c}\int_0^{t_c} \exp\{-iRF(t)\}H_D\exp\{iRF(t)\}dt \qquad (4)$$

for the homo-nuclear dipolar interactions, $$\frac{1}{t_c}\int_0^{t_c} \exp\{-iRF(t)\}I_Z\exp\{iRF(t)\}dt \qquad (5)$$

for the inhomogeneous interactions, and $$\frac{1}{t_c}\int_0^{t_c} \exp\{-iRF(t)\}g(t)I_Z\exp\{iRF(t)\}dt \qquad (6)$$

for the gradient interaction.

Prior art pulse sequences were designed so that the dipolar and inhomogeneous average Hamiltonians (Equations (4) and (5)) became zero, but the gradient average Hamiltonian (defined by equation (6)) was non-zero. These conditions allowed averaging of the dipolar and inhomogeneous interactions, while leaving the gradient interaction to drive the evolution of the spin dynamics. However, it was found that even when the conditions of equations (4)–(6) were met as described, high quality images were not obtained. This happened because the gradient evolution is as strong an interaction as the RF pulse interaction and, consequently, could not be neglected in defining the interaction frame.

When the gradient interaction is taken into account in defining the interaction frame, the correct zero-order average Hamiltonian appears as defined by the following:

$$\frac{1}{t_c}\int_0^{t_c} \exp\{-i[RF(t) + \vec{g}(t)\cdot\vec{r}I_Z]\}H_D\exp\{i[RF(t) + \vec{g}(t)\cdot\vec{r}I_Z]\}dt \qquad (7)$$

instead of the simplified version in Equation (4). The gradient appears in the interaction frame transformation as expected, but the transformation, and hence the average dipolar Hamiltonian, also depends on the spin packet's spatial location. This dependency introduces a spatial heterogeneity, which, in turn, has led to images with resolutions that vary with image location (most often yielding an image with high resolution at the center and decreasing resolution towards the edges). The same effect is encountered in NMR spectroscopy where the spectral resolution often varies with the frequency offset from resonance.

It has been found that it is possible to remove the normal spatial dependence from the interaction frame which is embodied in Equation (7). In particular, in one prior art experiment, this is done by (1) arranging the RF pulse sequences and the gradient pulse sequences so that the RF fields and the gradient fields do not overlap in time, and (2) selecting RF pulse sequences so that the sub-cycles of RF modulation between gradient pulses are either cyclic or anti-cyclic (that is have propagators that equal $+1$ or $-1$).

The effect of these conditions is to allow the RF propagator and the gradient propagator to commute in such a manner that the gradient and RF interactions become decoupled as explained in detail below. However, this decoupling occurs only to the zero-order approximation. The higher order terms in the Magnus expansion are not negligible and still cause coupling between the line-narrowing and gradient interactions which results in a variation of the resolution over an image, albeit that this latter variation is reduced from the variation in the non-decoupled case.

Accordingly, it is an object of the present invention to provide a method for operating a solid-state NMR imaging system so that the resulting images have more uniform resolution over the entire image.

It is another object of the present invention to provide a method for operating a solid-state NMR imaging system in which line-narrowing can be carried out without introducing an inhomogeneity in the overall spatial resolution.

It is another object of the present invention to provide a method for operating a solid-state NMR imaging system in which the spatial dependency of the average dipolar Hamiltonian which results from line-narrowing is eliminated to a second order approximation.

It is still another object of the present invention to provide a method for operating a solid-state NMR imaging system in which the spatial resolution is uniform and which method can be used with a variety of conventional line-narrowing RF pulse sequences.

SUMMARY OF THE INVENTION

The foregoing problems are solved and the foregoing objects are achieved in one illustrative embodiment of the invention in which a pulsed gradient is interleaved between sub-cycles of the line-narrowing RF pulse sequence in such a manner that the RF and gradient fields do not overlap in time, the sub-cycles of RF modulation which occur between gradient pulses are either cyclic or anti-cyclic and symmetric.

More particularly, in one embodiment, a conventional multiple RF pulse "time-suspension" pulse sequence is used. The preferred pulse sequence can be broken into sub-cycles, each of which is dipolar decoupling to both zero-order and second order in the delta approximation. The gradient pulses are placed a selected set of the sub-cycles which are symmetric. In this manner the prior art zero-order decoupling of the line-narrowing interaction and the gradient interaction is extended to include the zero order, all odd order terms and the second order term in the Magnus expansion of the average dipolar Hamiltonian.

In another embodiment, a specific RF pulse sequence is designed which meets specified criteria in accordance with the principles of the invention. With proper selection of the sequence, the gradient interaction is decoupled from the line-narrowing interaction to zero order, all odd order and the second order terms.

More particularly, the sequence is chosen so that it is cyclic or anti-cyclic, dipolar decoupling to the second order and symmetric.

DETAILED DESCRIPTION OF PREFERRED EMBODIMENTS

Figure 1A:
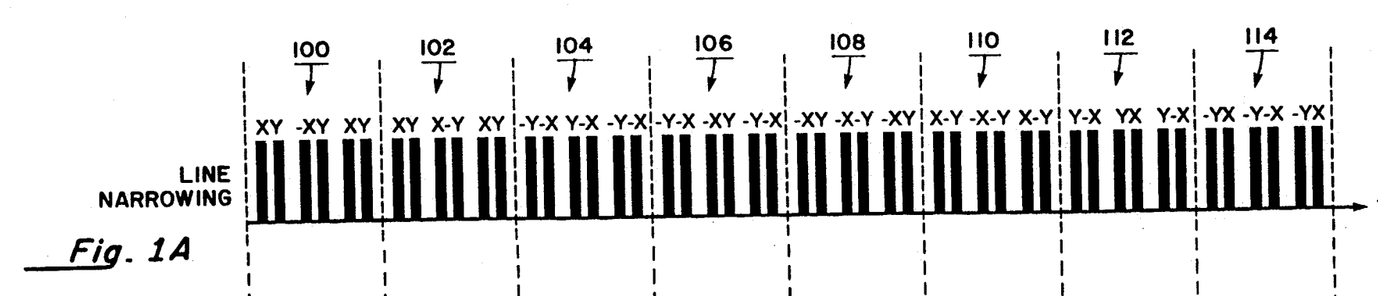
FIGS. 1A-1B are graphs of the RF pulse sequence, and pulsed gradient for a prior art solid-state imaging experiment illustrating the spatial variation in line width caused by coupling between the line narrowing and gradient interactions.
Figure 1B:
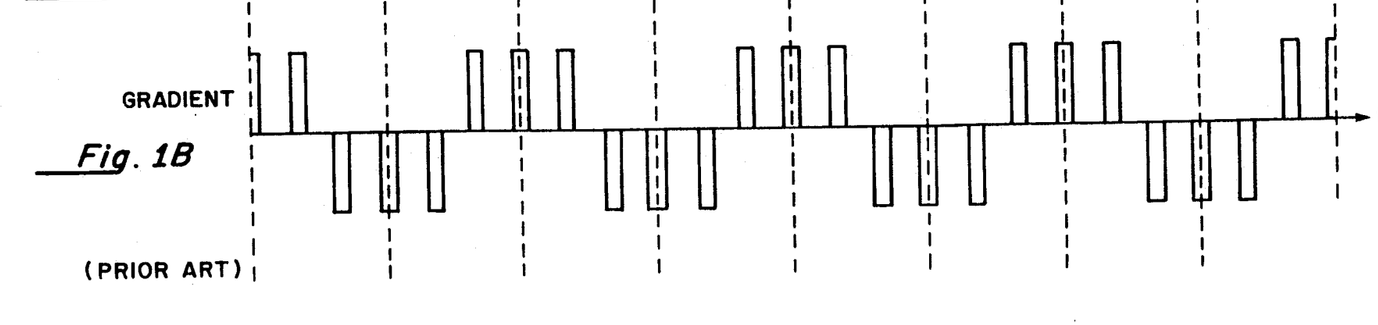

FIGS. 1A and 1B schematically illustrate a typical prior art solid-state imaging experiment utilizing a 48 RF pulse "time suspension" line-narrowing sequence. This sequence has the property that it temporally averages both linear and bi-linear $I_z$ Hamiltonians to zero. The sequence is composed of eight composite inversion pulses 100–114.

Figure 2:
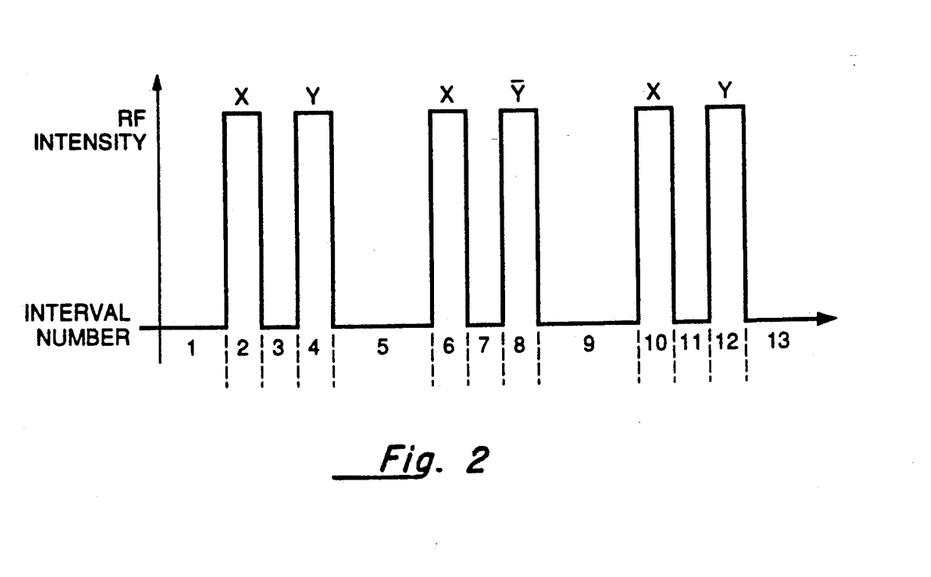
FIG. 2 is a schematic illustration of a known six-pulse dipolar decoupled inversion pulse with the various time intervals denoted.

Composite pulses and their characteristics are known in the art and are composed a six RF pulse sequence shown in FIG. 2. The six-pulse sequence is made of thirteen time intervals numbered illustratively as intervals 1–13. There are three pulse pairs with each pulse having a time duration of $a$ which comprise time intervals 2, 4, 6, 8, 10 and 12. A time delay of $\tau$ between pulses comprises time intervals 3, 7, and 11. In a standard solid echo pulse pair this delay is set at one-half of the time intervals between pulse pairs (time intervals 1, 5, 9 and 13). The details of composite inversion pulses and time-suspension sequences are described in more detail, for example, in "Time Suspension Multiple Pulse Sequences: Application to Solid State Imaging", D. G. Cory, J. B. Miller and A. N. Garroway, *Journal of Magnetic Resonance*, v. 90, p. 205 (1990), which article is hereby incorporated by reference.

FIG. 1A represents the RF pulses versus time in which each rectangle represents a separate RF pulse. The vertical axis represents the amplitude of the pulses which will be determined by various known factors. The relative phasing of the pulses is denoted by the notations, X, Y, etc. over each pulse. By convention, the applied fields are referenced to a Cartesian coordinate system with the applied Zeeman field pointing along the Z-axis. The applied RF fields are polarized 90° to the Zeeman field or along the X and Y axes. Since the X and Y axes are arbitrary directional designations, the pulse designations of X and Y are taken to represent relative phases of the RF field. For example a RF pulse designated as an X pulse has a relative phase shift of 90° with respect to an RF pulse designated as a Y pulse. Similarly, an RF pulse designated as X or $-X$ has a relative phase shift of 180° with respect to an X pulse.

FIG. 1B schematically illustrates the pulsed gradient applied to the imaging sample to produce the image in which each rectangle represents an application of the gradient to the sample. The relative pulse timing with respect to the RF pulses is well-known and is schematically illustrated in the figure. The gradient pulses are arranged in a "quasi-continuous wave" fashion. If the gradient were constantly applied to the sample, it would be time-independent and the resulting spin evolution would be averaged to zero by the RF pulse interaction. Consequently, it is necessary to make the gradient time-dependent. The particular pulse sequence is used to approximate a continuous gradient by associating as many gradient pulses with a composite inversion pulse as possible while still preserving the gradient interaction. The gradient polarity is periodically reversed so that the gradient evolution builds up over time.

Figure 3:
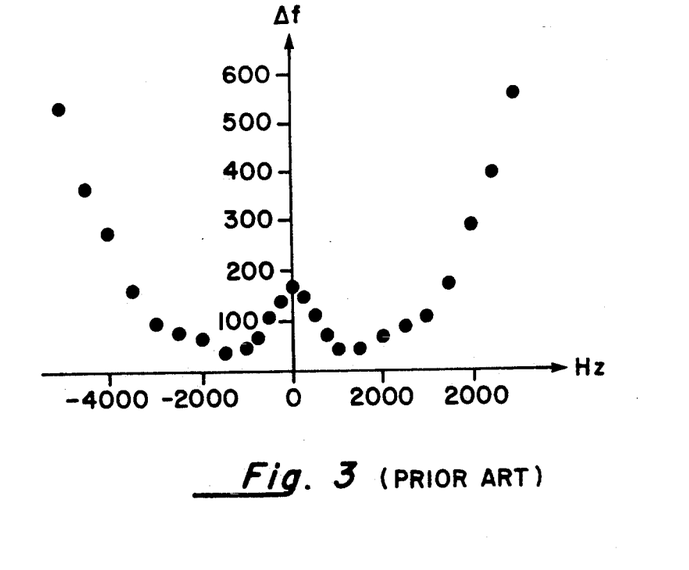
FIG. 3 is a graph of line width versus gradient strength for the experiment shown in FIGS. 1A-1B, showing the spatial variation in line width.

The remaining details of the experiment are conventional and are not discussed. The results of the experiment are shown in FIG. 3 which illustrates the change in line width over the width of a sample. The horizontal axis of FIG. 3 represents the gradient strength represented as frequency. The gradient frequency spread is plotted relative to the resonant frequency at 0 Hz. The vertical axis represents the line width also plotted in frequency.

Since the line width is directly related to the resolution of the image, with smaller line widths corresponding to higher resolution, FIG. 3 also represents the resolution across the sample. The sample material used to generate the graph illustrated in FIG. 3 is a type of poly oxy methylene plastic material sold under the tradename of DELRIN by E. I. Dupont DeNemours & Company.

An examination of FIG. 3 illustrates the fact that the line width increases, and hence the resolution, decreases towards the outer edges of the sample due to coupling between the line-narrowing interaction and the gradient interaction as described above.

As previously mentioned, it is possible to remove the normal spatial dependence from the interaction frame which is embodied in Equation (7) and illustrated in FIG. 3. This can be done by (1) arranging the RF pulse sequences and the gradient pulse sequences so that the RF fields and the gradient fields do not overlap in time, and (2) selecting RF pulse sequences so that the sub-cycles of RF modulation between gradient pulses are either cyclic or anti-cyclic (that is have propagators that equal $+1$ or $-1$).

The effect of these conditions can be determined by examining the integrand of the zero-order averaged Hamiltonian, as set forth in Equation (7). With conditions (1) and (2) in the preceding paragraph satisfied, the average Hamiltonian can be separated into a number of intervals, each of which corresponds to a piece-wise constant interaction frame state for the dipolar Hamiltonian. Since the RF pulse sub-cycles and the gradient pulses alternate, these "toggling frame" states alternate between RF propagators and gradient propagators, with the $n^{th}$ state being given by, $$\overline{H_D} = \ldots U_{rf,n-1} U_{g,n-1} U_{rf,n} U_{g,n} H_D U^+_{g,n} U^+_{rf,n} U^+_{g,n-1} U^+_{rf,n-1} \quad (8)$$

where $U_{g,i}$ is the propagator for the $i^{th}$ gradient interval and $U_{rf,i}$ is the propagator for the $i^{th}$ RF interval and the symbol $(+)$ indicates a transpose. Since the experiment is carried out at high field, only the secular portions of the Hamiltonians (those that commute with $I_z$) are of interest and the dipolar Hamiltonian is a bi-linear $I_z$ interaction, whereas the gradient Hamiltonian is a linear $I_z$ interaction.

The conditions (1) and (2) discussed above allow Equation (8) to be simplified. In particular, the gradient propagator does not rotate the $I_z$ states (e.g. the gradient propagator commutes with $I_z$). In addition, because the RF pulse sequence is chosen so that its propagator is either $+1$ or $-1$, the RF propagator is a scalar and therefore commutes with all spin states. These two properties allow Equation (8) to be rearranged as follows:

$$\overline{H_D} = \ldots U_{g,n-1} U_{g,n} U_{rf,n-1} U_{rf,n} H_D U^+_{rf,n} U^+_{rf,n-1} U^+_{g,n} U^+_{g,n-1} \quad (9)$$

The overall conclusion from Equation (9) is that, to a zero-order approximation, the RF averaging terms behave as if there were no gradient present so that they average to zero and that, therefore, the gradient has been decoupled from the dipolar decoupling caused by the RF pulse sequence.

Figure 4A:
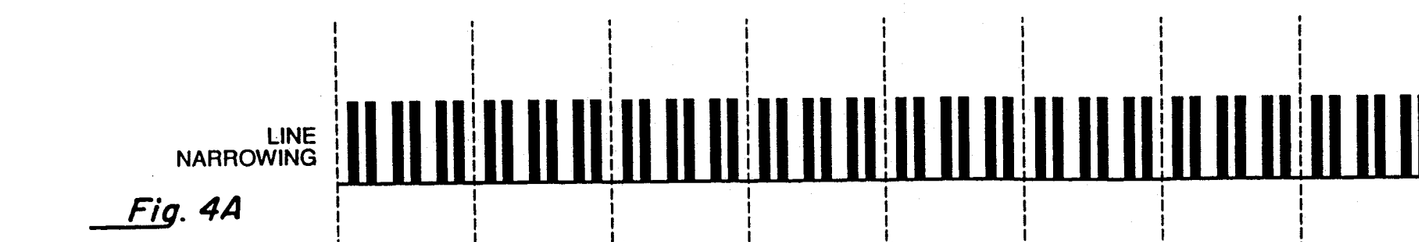
FIGS. 4A-4B are graphs of the RF line-narrowing pulse sequence and pulsed gradient for another prior art experiment which illustrates a line-narrowing pulse sequence used together with a pulsed gradient to decouple the gradient to a zero-order approximation.
Figure 4B:
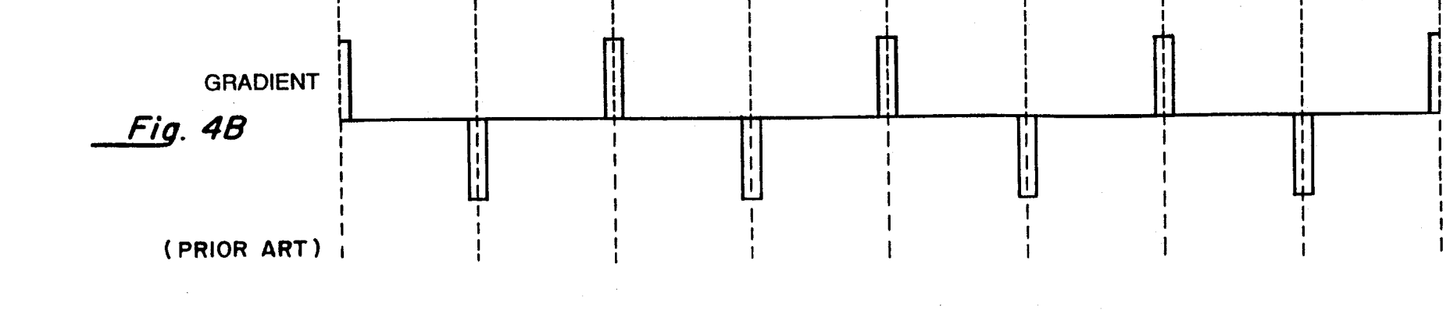

When the foregoing principles are applied to an imaging experiment, an experiment such as illustrated in FIGS. 4A–4B results. FIG. 4A represents the line-narrowing RF pulse sequence. FIG. 4B represents the gradient pulse sequence applied in accordance with the principles above.

There are many alternatives available for the RF pulse line-narrowing sequence. In FIG. 4A, the sequence chosen is the 48-pulse time suspension sequence used in the experiment illustrated in FIG. 1A. This approach uses dipolar decoupled inversion pulses each of which has a propagator equal to $-1$ (they are anticyclic). Each group of six RF pulses is dipolar decoupling in a zero-order approximation including the effects of finite pulse widths and to a second order approximation in a delta-function approximation. By placing the gradient pulses outside of the inversion pulse sub-cycles, the zero order averaging of the dipolar Hamiltonian is unaffected. By pulse cycle decoupling, the second order terms also remain zero.

Figure 5:
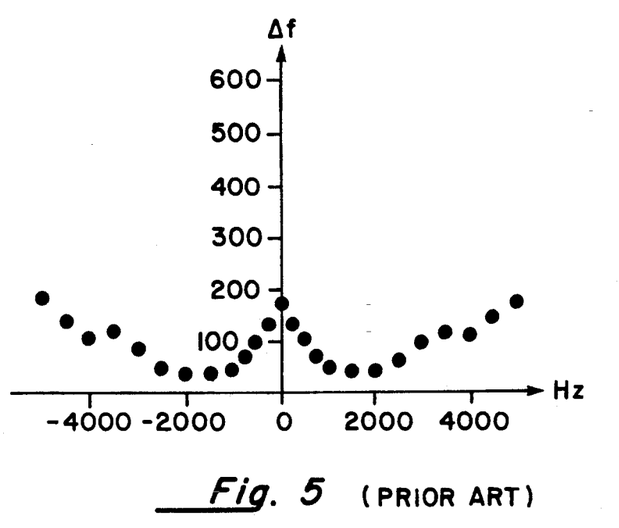
FIG. 5 is a graph of line width versus gradient strength for the experiment shown in FIGS. 4A-4B.

The results of the experiment illustrated in FIGS. 4A-4B is shown in FIG. 5 which represents a plot of line width versus gradient strength similar to that shown in FIG. 2 for a sample of DELRIN. A comparison of FIGS. 2 and 5 indicates that the variation of the linewidth across the sample has been reduced due to the decoupling of the line-narrowing and the gradient interactions.

The grouping of terms used in equation (8) is also valid in zero-order average Hamiltonian theory including finite pulse width effects. However, the influence of higher-order terms, at least through second order, is also important. Unfortunately, the technique as illustrated does not decouple odd order terms, including first order terms in the Magnus expansion. Accordingly, the technique is limited.

In accordance with the principles of the invention, it has been found that decoupling can be extended to higher order approximation terms with some additional constraints. More particularly, for odd-ordered average Hamiltonian terms in the conventional Magnus expansion of the Hamiltonian, decoupling can be accomplished by separating gradient pulses by RF pulse subcycles that are symmetric in time. For second order average Hamiltonian terms, gradient decoupling can be accomplished by selecting an RF pulse sub-cycle which is either cyclic or anti-cyclic and for which the second order average Hamiltonian term vanishes for the subcycle.

Figure 6A:
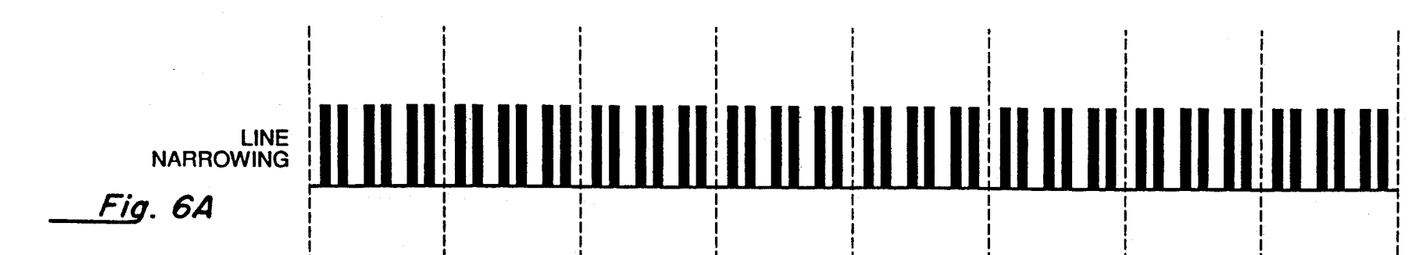
FIGS. 6A-6B are graphs of the RF pulse sequence and pulsed gradient which illustrates a line-narrowing pulse sequence used together with a pulsed gradient in accordance with the invention to decouple the gradient to all odd orders of approximation and to second-order of the even order approximations.
Figure 6B:
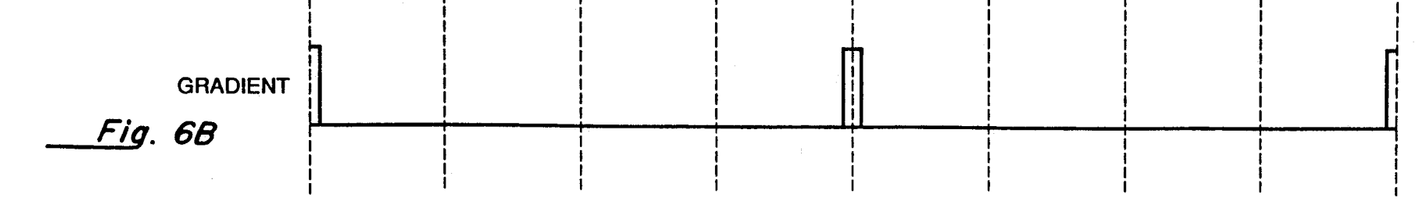

An imaging experiment arranged in accordance with the principles of the invention and which utilizes the inventive methods described in the preceding paragraph to achieve zero-order, odd order and even order (through second order) decoupling is shown in FIGS. 6A-6B. FIG. 6A represents the line-narrowing RF pulse sequence which illustrates the same RF pulse sequence used in FIGS. 1A and 4A. FIG. 6B represents the gradient pulse sequence applied in accordance with the principles of the present invention.

Figure 7:
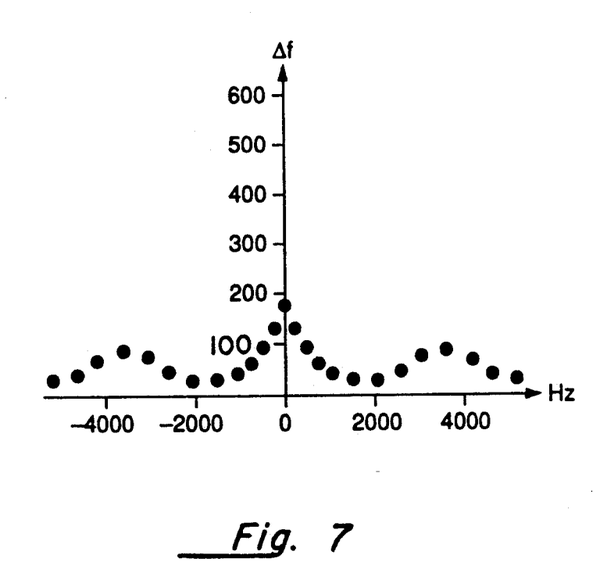
FIG. 7 is a graph of line width versus gradient strength for the experiment shown in FIGS. 6A-6B.

FIG. 7 shows the results of the experiment illustrated in FIGS. 6A-6B and represents a plot of line width versus gradient strength similar to that shown in FIGS. 2 and 5 for a sample of DELRIN. A comparison of FIGS. 2, 5 and 7 indicates that the variation of the linewidth across the sample has been reduced even further due to the decoupling of the line narrowing and the gradient interactions to a higher order approximation.

Figure 8A:
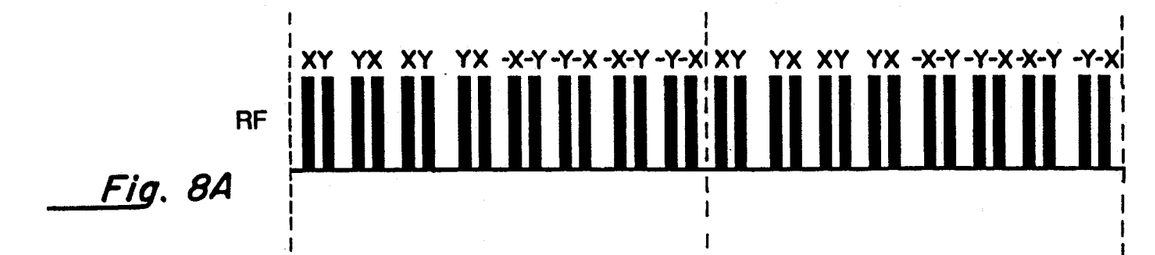
FIGS. 8A-8B are graphs of an RF pulse sequence and pulsed gradient which illustrates an additional line-narrowing pulse sequence used together with a pulsed gradient in accordance with the invention to decouple the gradient to zero-order and all odd orders of approximation.
Figure 8B:
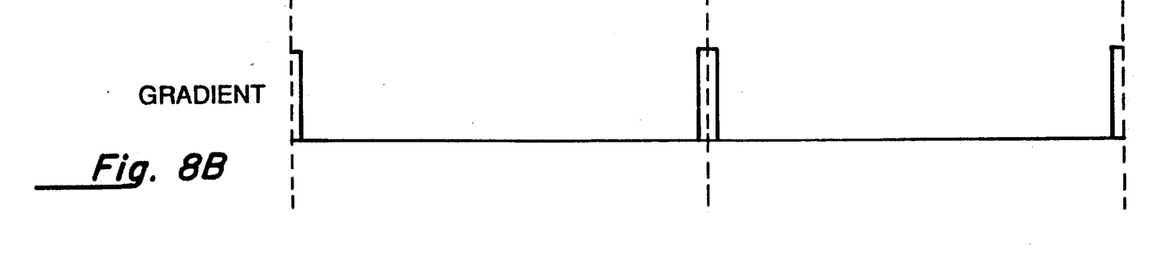

An additional imaging experiment arranged in accordance with the principles of the invention and which utilizes the inventive methods described above to achieve zero order, odd order and even order (through second order) decoupling is shown in FIGS. 8A-8B. FIG. 8A represents a different line-narrowing RF pulse sequence which achieves line-narrowing. This sequence is a prior art sequence which is described in detail in "Nutation Sequences For Magnetic Resonance Imaging I Solids", H. M. Cho, C. J. Lee, D. N. Shykind and D. P. Weitekamp, *Physical Review Letters*, v. 55, p. 1923 (1985). FIG. 8B represents the gradient pulse sequence applied in accordance with the principles of the present invention. This experiment achieves gradient decoupling to zero-order and all odd orders, but not to even orders of approximation.

It is possible to use the principles of the present invention to design an experiment in which gradient pulses are intercalated into existing RF pulse line-narrowing sequences. However, it is also possible to design new RF pulse sequences which meet the criteria discussed above and reiterated below, which new RF pulse sequences can be inserted between gradient pulses in order to achieve line-narrowing with a decoupled gradient interaction.

Figure 9:
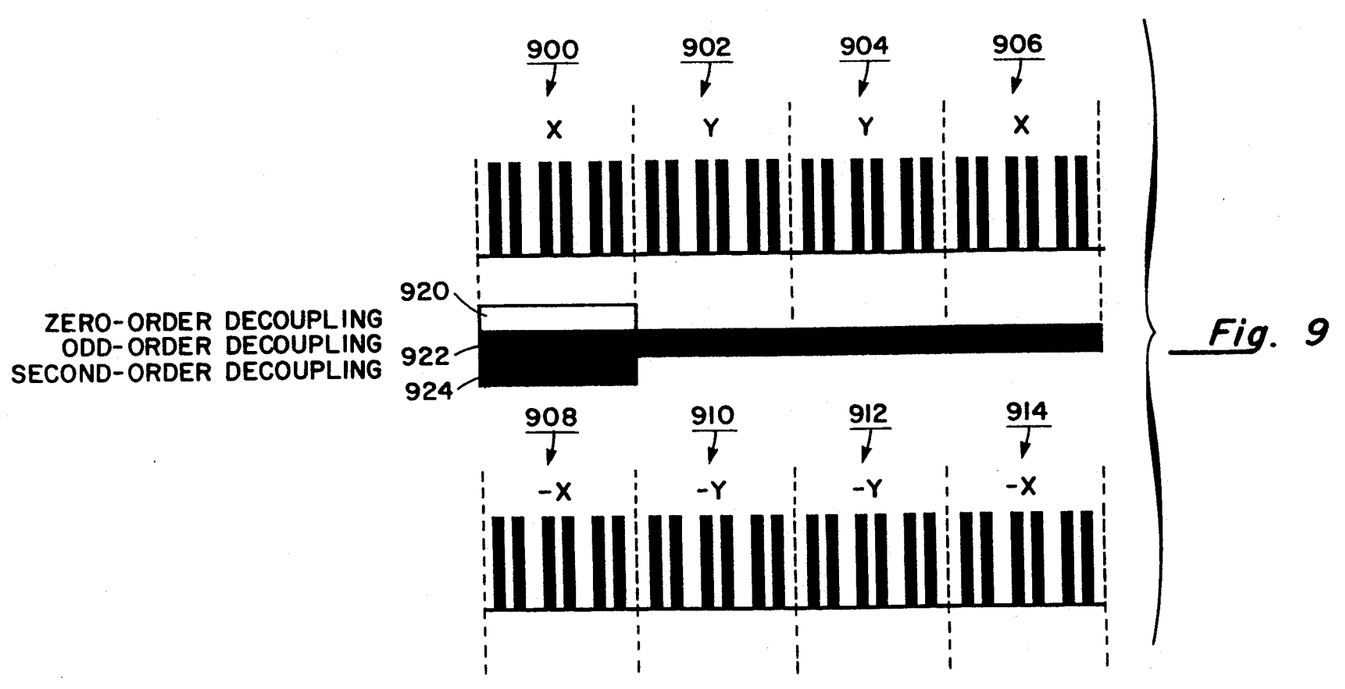
FIG. 9 is a schematic horizontal bar chart which how much of an RF pulse cycle must be included between gradient pulses to achieve gradient decoupling to varying degrees of approximation.

FIG. 9 is a bar chart which illustrates how much of an RF pulse sequence (a 48-pulse time suspension sequence is shown for purposes of illustration) must be included between gradient pulses to achieve decoupling to various orders of approximation. In order to achieve zero order decoupling, the RF pulse subcycle between gradient pulses must be cyclic or anti-cyclic and dipolar decoupling to zero-order. As each dipolar composite inversion pulse (each composed of six RF pulses) of the pulse sequence shown meets this criterion, zero-order decoupling will be achieved if a composite pulse is included between gradient pulses as illustrated by the bar chart section 920.

For decoupling to occur over all of the odd-ordered terms of the Magnus expansion, the RF pulse subcycles which appear between gradient pulses should be cyclic and symmetric. In the 48-pulse sequence illustrated, the sequence does not become symmetric until 24 pulses have occurred as illustrated in bar chart 922. Thus four composite pulses or twenty-four single pulses must be included between gradient pulses.

For decoupling to occur over even terms in the Magnus expansion, at least to second order, the RF pulse subcycles appearing between gradient pulses should be dipolar decoupling to second order and cyclic or anti-cyclic. As each dipolar composite inversion pulse (each composed of six RF pulses) meets this criterion, second order decoupling will be achieved if a composite pulse is included between gradient pulses as illustrated by the bar chart section 924.

Although only a few embodiments of the inventive decoupling method have been described, several modifications and changes will be immediately apparent to those skilled in the art. For example, the illustrated RF line-narrowing pulse sequences may be modified in obvious ways to generate new pulse sequences which will perform according to the inventive method. These obvious modifications include utilizing different known RF line-narrowing pulse sequences which meet the criteria of the inventive method. For example, in order to achieve zero-order decoupling, the dipolar decoupled composite inversion pulses illustrated in FIG. 4A could be replaced with a WAHUHA pulse sequence with suitable pulse width to cycle time ratio. The WAHUHA pulse sequence is described in detail in U.S. Pat. No. 3,530,374, the description of which is hereby incorporated by reference.

In addition, in order to achieve gradient decoupling in all odd-order terms of the Magnus expansion, the dipolar decoupled composite inversion pulses illustrated in FIG. 6A could be replaced with a MREV-8 pulse sequence for the dipolar decoupled composite inversion pulses illustrated in FIG. 6A. The entire MREV-8 pulse sequence is inserted between gradient pulses. The MREV-8 pulse sequence is described in detail in articles by P. Mansfield, *Journal of Physical Chemistry*, V. 4, p. 1444 (1971) and W. K. Rhim, D. D. Elleman and R. W. Vaughan, *Journal of Chemical Physics*, v. 58, p. 1772 (1972), the description of which is hereby incorporated by reference.

In order to achieve gradient decoupling in even-order terms of the Magnus expansion through second order, the dipolar decoupled composite inversion pulses illustrated in FIG. 6A could be replaced with a BR-24 pulse sequence. The entire BR-24 pulse sequence is inserted between gradient pulses. The BR-24 pulse sequence is described in detail in an article by D. P. Burum and W. K. Rhim, *Journal of Chemical Physics*, v. 71, p. 944 (1979), the description of which is hereby incorporated by reference.

Other classes of RF subcycles which are suitable for use with the present invention include pulses that are dipolar decoupling through second-order approximation in average Hamiltonian theory as discussed in detail in "A New Multiple-Pulse Cycle For Homonuclear Dipolar Decoupling", D. G. Cory, *Journal of Magnetic Resonance*, v. 94, p. 526 (1991). Other pulse sequences of use are also magic echo subcycles discussed in detail in "Solid State NMR Imaging by Magic Sandwich Echoes", S. Matsui, *Chemical Physics Letters*, v. 179, p 187 (1991). and "Spatially Resolved Proton NMR Dipolar Spectra as a Measurement of Local Molecular Mobility in Solids", S. Matsui, *Journal of Magnetic Resonance*, v. 95, p. 149 (1991).

For the pulsed gradient modulation shown in FIG. 4B, an optimal approach exists, since the overall pulse cycle time must be short and the gradient must be off during the RF pulse train. Pulsed gradients as short as 4 $\mu$s are satisfactory.

What is claimed is:

1. In an NMR imaging experiment for obtaining spatial spin density data of nuclei in a solid object in which said nuclei are placed in a magnetic field and excited with a radio frequency pulse and output magnetization is subsequently detected, a method for improving image resolution comprising the steps of:
A. applying a pulsed magnetic field having a spatial gradient to said nuclei, said pulsed field having at least two pulses and;
B. irradiating said nuclei with at least one radio-frequency pulse sequence after said nuclei are excited and before said output magnetization is detected, said pulse sequence being composed of at least one pulse subcycle which occurs between said gradient pulses, said subcycle having a scalar propagator, being symmetric and dipolar decoupling to at least the zero order of approximation.

2. In an NMR imaging experiment for obtaining spatial spin density data of nuclei in a solid object, the method according to claim 1 wherein step A comprises the step of:
A1. applying a pulsed magnetic field composed or periodic gradient pulses.

3. In an NMR imaging experiment for obtaining spatial spin density data of nuclei in a solid object, the method according to claim 1 wherein step B comprises the step of:
B1. applying a radio-frequency pulse sequence which time averages the dipolar Hamiltonian to zero by coherent averaging.

4. In an NMR imaging experiment for obtaining spatial spin density data of nuclei in a solid object, the method according to claim 1 wherein step B comprises the step of:
B2. applying a radio-frequency pulse sequence in which said subcycle is cyclic.

5. In an NMR imaging experiment for obtaining spatial spin density data of nuclei in a solid object, the method according to claim 1 wherein step B comprises the step of:
B3. applying a radio-frequency pulse sequence in which said subcycle is anti-cyclic.

6. In an NMR imaging experiment for obtaining spatial spin density data of nuclei in a solid object, the method according to claim 1 wherein step B comprises the step of:
B4. applying a radio-frequency pulse sequence in which said subcycle is dipolar decoupling at least to a second order approximation.

7. In an NMR imaging experiment for obtaining spatial spin density data of nuclei in a solid object in which said nuclei are placed in a magnetic field and excited with a radio frequency pulse and output magnetization is subsequently detected, a method for improving image resolution comprising the steps of:
A. irradiating said nuclei with at least one radio-frequency pulse sequence after said nuclei are excited and before said output magnetization is detected, said pulse sequence being composed of a periodic sequence of pulse subcycles, each of said pulse subcycles having a scalar propagator, being symmetric and dipolar decoupling to at least the zero-order of approximation; and
B. applying a pulsed magnetic field having a spatial gradient to said nuclei, said pulsed field having a plurality of gradient pulses intercalated between said pulse subcycles.

8. In an NMR imaging experiment for obtaining spatial spin density data of nuclei in a solid object, the method according to claim 7 wherein step A comprises the step of:
A1. irradiating said nuclei with a time suspension line-narrowing radio-frequency pulse sequence composed of a periodic sequence of composite inversion pulses.

9. In an NMR imaging experiment for obtaining spatial spin density data of nuclei in a solid object, the method according to claim 8 wherein step A1 comprises the step of:
A1'. irradiating said nuclei with a time suspension line-narrowing radio-frequency pulse sequence composed of a periodic sequence of eight composite inversion pulses.

10. In an NMR imaging experiment for obtaining spatial spin density data of nuclei in a solid object, the method according to claim 9 wherein step B comprises the step of:
B1. intercalating said gradient pulses between said subcycles consisting of four composite inversion pulses.

11. In an NMR imaging experiment for obtaining spatial spin density data of nuclei in a solid object, the method according to claim 7 wherein step A comprises the step of:
A2. irradiating said nuclei with a line narrowing radio-frequency pulse sequence composed of a periodic sequence of the radio-frequency pulses: X, Y, Y, X, X, Y, Y, X, −X, −Y, −Y, −X, −X, −Y, −Y, −X where the phase of an X pulse differs from the phase of a Y pulse by 90°, the phase of an X pulse differs from the phase of a −X pulse by 180° and the phase of an Y pulse differs from the phase of a −Y pulse by 180°.

12. In an NMR imaging experiment for obtaining spatial spin density data of nuclei in a solid object, the method according to claim 11 wherein step B comprises the step of:
B2. intercalating said gradient pulses between said subcycles consisting of the radio-frequency pulse sequence set forth in step A2.

13. In an NMR imaging experiment for obtaining spatial spin density data of nuclei in a solid object, the method according to claim 7 wherein step A comprises the step of:

A3. irradiating said nuclei with an MREV-8 pulse sequence.

14. In an NMR imaging experiment for obtaining spatial spin density data of nuclei in a solid object, the method according to claim 13 wherein step B comprises the step of:

B3. intercalating said gradient pulses between said subcycles consisting of an MREV-8 pulse sequence.

15. In an NMR imaging experiment for obtaining spatial spin density data of nuclei in a solid object, the method according to claim 7 wherein step A comprises the step of:

A4. irradiating said nuclei with a BR-24 pulse sequence.

16. In an NMR imaging experiment for obtaining spatial spin density data of nuclei in a solid object, the method according to claim 15 wherein step B comprises the step of:

B4. intercalating said gradient pulses between said subcycles consisting of a BR-24 pulse sequence.

* * * * *